United States Patent
Nolan et al.

(10) Patent No.: US 7,382,183 B2
(45) Date of Patent: Jun. 3, 2008

(54) MINIMIZING SWITCHING NOISE AND ITS EFFECTS IN AUTO-ZEROED AMPLIFIERS

(75) Inventors: James B. Nolan, Chandler, AZ (US); Kumen Blake, Gilbert, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 11/774,648

(22) Filed: Jul. 9, 2007

(65) Prior Publication Data

US 2008/0018392 A1    Jan. 24, 2008

Related U.S. Application Data

(60) Provisional application No. 60/807,660, filed on Jul. 18, 2006.

(51) Int. Cl.
*H03F 1/02* (2006.01)
(52) U.S. Cl. .............................. 330/9; 330/69
(58) Field of Classification Search .................. 330/9, 330/51, 69; 327/124, 307
See application file for complete search history.

(56) References Cited

U.S. PATENT DOCUMENTS

| | | | |
|---|---|---|---|
| 6,653,895 B1 | 11/2003 | Douts et al. | 330/9 |
| 6,734,723 B2 * | 5/2004 | Huijsing et al. | 330/9 |
| 7,265,615 B2 * | 9/2007 | Alexander et al. | 330/69 |

* cited by examiner

*Primary Examiner*—Khanh V Nguyen
(74) *Attorney, Agent, or Firm*—Baker Botts L.L.P.

(57) ABSTRACT

Two nulling amplifiers are used with an auto-zeroed differential amplifier. While one nulling amplifier is compensating the main amplifier, the other nulling amplifier is being zeroed for both differential mode (DM) and common mode (CM) offsets. By using two nulling amplifiers, one always connected to the main amplifier, a relatively constant open-loop gain is maintained for the main amplifier. A further improvement is make-before-break timing overlap of the switch operations between the two nulling amplifiers and the main amplifier. This ensures that the main amplifier is continuously driven by one or both null amplifiers, thereby maintaining a low impedance at the main amplifier auxiliary port. Both DM and CM offset sampling and precharging of each of the two nulling amplifiers is performed so as to substantially reduce switching glitches in the output of the main amplifier.

32 Claims, 9 Drawing Sheets

Figure 1 (Prior Technology)

MINIMIZING SWITCHING NOISE AND ITS EFFECTS IN AUTO-ZEROED AMPLIFIERS

RELATED PATENT APPLICATION

This application claims priority to commonly owned U.S. Provisional Patent Application Ser. No. 60/807,660; filed Jul. 18, 2006; entitled "Minimizing Switching Noise and its Effects in Autozero Amplifiers," by James B. Nolan and Kumen Blake; which is hereby incorporated by reference herein for all purposes.

TECHNICAL FIELD

The present disclosure relates to integrated circuit operational amplifiers, and more particularly, to an integrated circuit auto-zeroed operational amplifier having minimized switching noise.

BACKGROUND

Auto-zeroed operational amplifiers are a class of analog circuits that combine analog and digital (switching) circuitry resulting in very low input-referred DC offset and noise. These operational amplifiers are often used in precision applications where high gain is necessary to resolve very small voltages. Examples include RTD, thermocouple, resistive current measurement and other sensing applications. The use of an auto-zeroed operational amplifier may relax the accuracy requirements of the A/D converter, saving cost. Today's auto-zeroed operational amplifiers bear little resemblance to the early chopping schemes that were used to reduce the average offsets. Those circuits were very simple using discrete amplifiers and switches to chop the amplifier's inputs and outputs using a clock. Heavy filtering was required to achieve low offset, and filter out the switching noise. Chopper amplifiers had a low frequency bandwidth, usually a few Hertz, limited by the large settling time constants.

Another scheme uses chopper stabilization of a wideband amplifier and a chopper amplifier. The chopper amplifier was used to "stabilize" or reduce the DC offset error of the wideband amplifier. Higher operating bandwidths were thereby achieved, but these chopped circuits had high output noise and required additional output signal filtering to be practical.

Early auto-zeroed amplifiers combined a wideband "main" amplifier and a single "nulling" amplifier. The single nulling amplifier has a sample and hold to correct its own offset, and to reduce the offset of the main amplifier. Early implementations required external capacitors and had sampling frequencies of a few hundred Hertz. Great improvements have been made in the state of the art over the years. Modern auto-zeroed operational amplifiers are now able to achieve DC offsets of a few microvolts with very low temperature drift.

However, due to the internal clock switching in the nulling amplifier, some switching noise will appear at the output. This will be most predominant around the sampling clock frequency. If this noise is not symmetric, i.e., generating substantially equal amounts of positive and negative glitches, an average DC offset may result in the system. Therefore, reduction of these glitches is essential for good DC performance and may require filtering. The filtering may be expensive depending upon how close the signal of interest is to the sampling frequency. Increasing the sampling rate is helpful to make filtering simpler and to increase the available bandwidth. Recent generations of auto-zeroed operational amplifiers have added clock spreading circuits to spread the switching noise over a wider range of frequencies allowing even higher useful bandwidths.

SUMMARY

Therefore there is a need for a way to overcome the above-identified problems as well as other shortcomings and deficiencies of existing technologies by providing new ways of minimizing switching noise and its effects in auto-zeroed operational amplifiers.

In a traditional auto-zeroed amplifier, a single nulling amplifier is used to compensate for the "main" (continuous) amplifier. During the zeroing cycle, the null amplifier is disconnected from the main amplifier, and the correction voltage is held on the main auxiliary port by a storage capacitor. This approach causes the open-loop gain to change between the compensation and nulling cycles because during the compensation cycle the total gain is the cascade of the null and main amplifiers while during the zeroing cycle the gain is that of just the main amplifier. This causes low frequency distortion (ripple) to appear at the output at multiples of the sampling frequency.

According to the teachings of this disclosure, a second null amplifier is added so as to compensate the main amplifier while the first null amplifier is being zeroed. This maintains the open-loop gain relatively constant, reducing the distortion inherent in the prior technology. A further improvement is that the timing of the switch operations between the two null amplifiers and the main amplifier is designed have a make-before-break overlap. This ensures that the main amplifier is continuously driven by one or both null amplifiers, maintaining a low impedance at the main amplifier auxiliary port and reducing the glitch energy at the output. A small flywheel capacitor may be added to further reduce the glitch magnitude. Two pair of zeroing switches are used, one for each null amplifier. By connecting one pair of zeroing switches opposite to the other, the glitch energy will tend to average out.

In order to reduce charge injection errors, the null amplifiers are implemented using a fully-differential topology. With two null amplifiers in the system, these may not have the same common-mode voltage due to transistor mismatches in their internal common-mode feedback loops. This can present a new source of glitching because the main auxiliary port "sees" a sharp change in common-mode when the null amplifiers switch. Therefore, a common-mode zeroing loop is included in addition to the normal differential mode zeroing loop so that both null amplifiers have approximately the same common-mode voltage. Zeroing of the two loops is done concurrently so no additional delay is incurred.

In prior technology auto-zeroed amplifiers, the null amplifier differential mode error (offset) is zeroed, then used to correct the main amplifier offset. Mismatches between the main and null amplifiers may cause glitches when the null amplifier is connected to the main auxiliary port. This is because at the end of the zeroing cycle the null amplifier output voltage may not the same as what the main auxiliary port needs to correct the main amplifier offset. Both a differential mode (DM) and common-mode (CM) step occurs when the two null amplifiers are switched. This may be minimized by precharging the nulling amplifier output levels to substantially the same DM and CM levels as are at the main auxiliary port.

According to a specific example embodiment of this disclosure, an auto-zeroing differential amplifier may comprise: a main amplifier having differential inputs, differential outputs, and an auxiliary port having differential inputs; a first nulling amplifier configured for differential and common mode self correction, the first nulling amplifier having differential inputs and outputs; a second nulling amplifier configured for differential and common mode self correction, the second nulling amplifier having differential inputs and outputs; first nulling amplifier input zeroing switches coupled to the main amplifier differential inputs and the first nulling amplifier differential inputs, wherein the first nulling amplifier input zeroing switches are used during offset zeroing of the main amplifier by the first nulling amplifier; second nulling amplifier input zeroing switches coupled to the main amplifier differential inputs and the second nulling amplifier differential inputs, wherein the second nulling amplifier input zeroing switches are used during offset zeroing of the main amplifier by the second nulling amplifier; first nulling amplifier output switches coupled between the first nulling amplifier differential outputs and the main amplifier auxiliary port differential inputs, wherein the first nulling amplifier output switches couple the first nulling amplifier differential outputs to the main amplifier auxiliary port differential inputs during offset zeroing of the main amplifier by the first nulling amplifier; and second nulling amplifier output switches coupled between the second nulling amplifier differential outputs and the main amplifier auxiliary port differential inputs, wherein the second nulling amplifier output switches couple the second nulling amplifier differential outputs to the main amplifier auxiliary port differential inputs during offset zeroing of the main amplifier by the second nulling amplifier; wherein when one of the nulling amplifiers is offset zeroing the main amplifier, the other nulling amplifier is doing a common-mode self offset zeroing, wherein both of the first and second nulling amplifiers are pre-charged so that the differential outputs thereof are at substantially the same correction voltage required for offset zeroing of the main amplifier.

According to a specific example embodiment of this disclosure, a method of minimizing switching noise in auto-zeroed amplifiers may comprise the steps of: providing a main amplifier having differential signal inputs and outputs, and differential auxiliary inputs; providing first and second nulling amplifiers having differential signal inputs, differential outputs and differential auxiliary inputs, wherein the differential signal inputs and differential outputs are switchably coupled to the main amplifier differential signal inputs and differential auxiliary inputs; nulling a differential mode (DM) offset error of the main amplifier by: storing the DM offset error in first and second DM offset error capacitors coupled to the first and second nulling amplifiers, respectively, and applying the stored DM offset error to the main amplifier differential auxiliary inputs; nulling a common mode (CM) offset error of the main amplifier by sampling the CM offset error, storing the CM offset error in first and second CM offset error capacitors coupled to the first and second nulling amplifiers, respectively, and applying the stored CM offset error to the main amplifier differential auxiliary inputs; and precharging the first and second nulling amplifier differential outputs to substantially the same voltage level at the main amplifier differential auxiliary inputs.

BRIEF DESCRIPTION OF THE DRAWINGS

A more complete understanding of the present disclosure thereof may be acquired by referring to the following description taken in conjunction with the accompanying drawings wherein.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

Referring now to the drawings, the details of specific example embodiments are schematically illustrated. Like elements in the drawings will be represented by like numbers, and similar elements will be represented by like numbers with a different lower case letter suffix.

Figure 1:
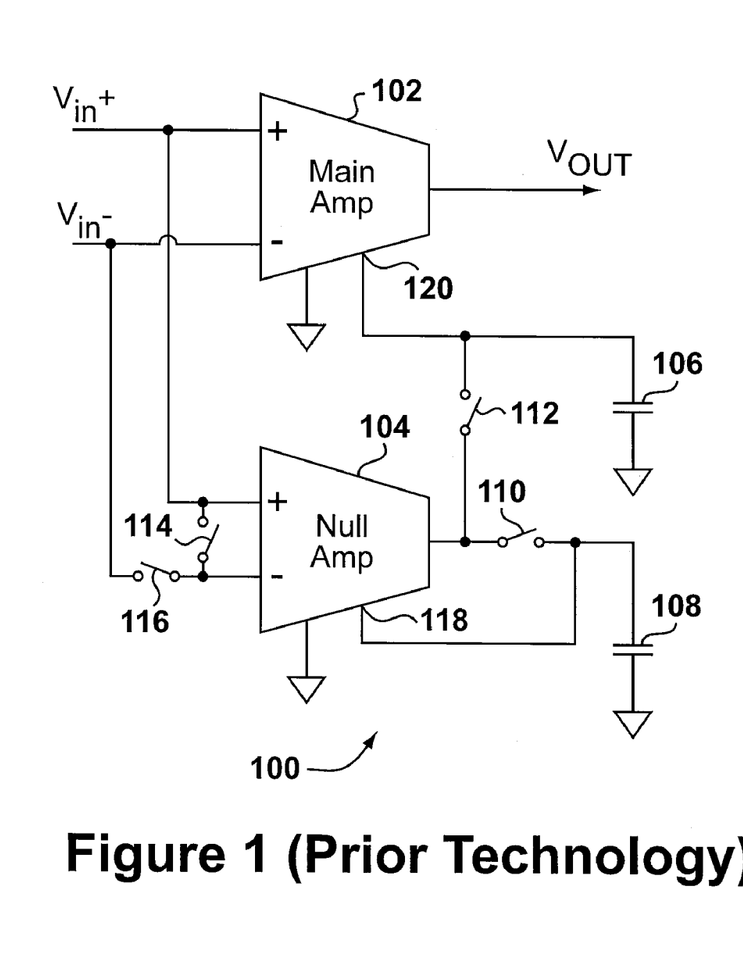
FIG. 1 illustrates a schematic block diagram of a prior technology auto-zeroed operational amplifier.

Referring to FIG. 1, depicted is a schematic block diagram of a prior technology auto-zeroed operational amplifier. The prior technology auto-zeroed amplifier, generally represented by the numeral 100, may comprise at least two amplifiers 102 and 104 that are combined to generate the final signal output. A conventional wide bandwidth "main" amplifier 102 is connected directly from input to output and continuously processes the incoming signal. A second, very high gain "nulling" amplifier 104 is connected in parallel for offset correction. The amplifier 104 is zeroed to null its own offset and to eliminate low frequency 1/f noise below the chopping frequency. Zeroing involves shorting together the two inputs of the amplifier 104 with switch 114 and storing the resulting offset onto a capacitor 108. During a compensation cycle, this correction voltage is applied to the nulling amplifier 104 through an auxiliary port 118. The correction voltage is held on the main auxiliary port 120 by a storage capacitor 106 when the nulling amplifier 104 is disconnected from the main amplifier 102 during its zeroing cycle. This correction voltage is then used to null the offset of the main amplifier 102 through another auxiliary port 120.

However, this approach causes the open-loop gain to change between the compensation and nulling cycles because during the compensation cycle the total gain is the cascade of the nulling amplifier 104 and the main amplifier and 102, while during the zeroing cycle the gain is that of just the main amplifier 102. This causes low frequency distortion to appear at the output at multiples of the sampling frequency. An oscillator and clock circuitry (not shown) are used to control the switches connected to the nulling amplifier 104.

Figure 2:
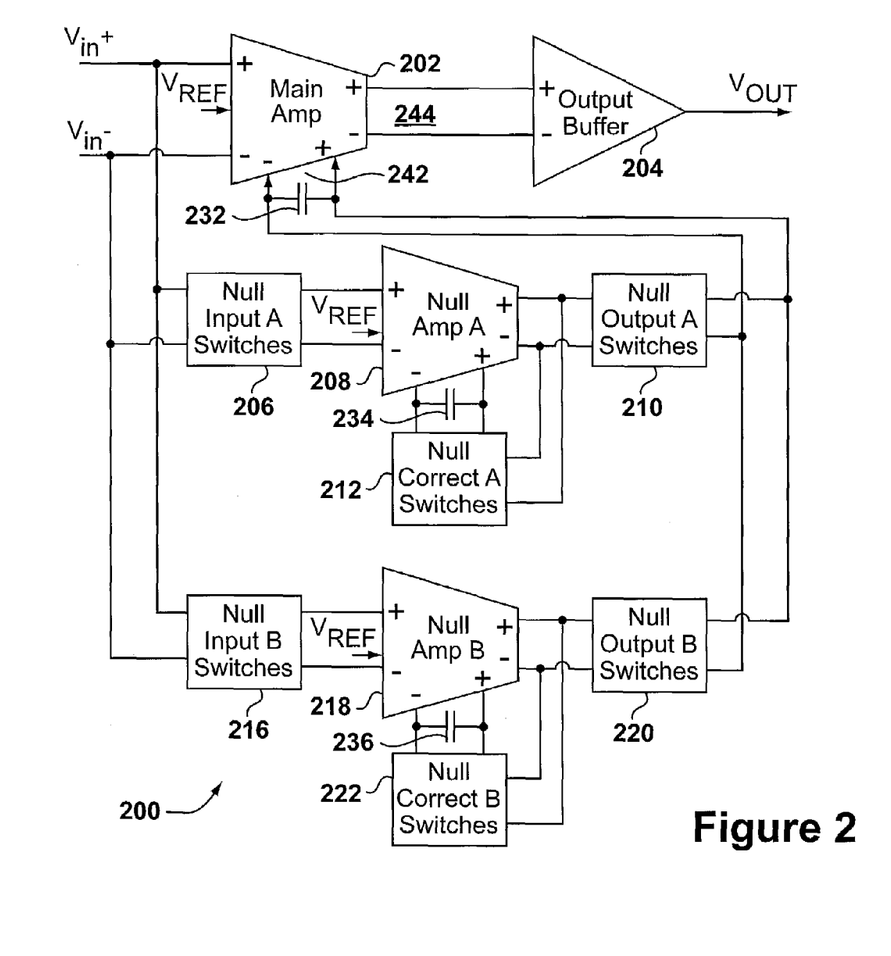
FIG. 2 illustrates a schematic block diagram of an auto-zeroed operational amplifier, according to a specific example embodiment of this disclosure.

Referring to FIG. 2, depicted is a schematic block diagram of an auto-zeroed operational amplifier, according to a specific example embodiment of this disclosure. The auto-zeroed operational amplifier, generally represented by the numeral 200, may comprise a main amplifier 202, a first nulling amplifier 208, a second nulling amplifier 218, switches 206, 210, 216, 220 and 222; and capacitors 232, 234 and 236. The second nulling amplifier 218 compensates the main amplifier 202 while the first nulling amplifier 208 is being zeroed. This maintains the open-loop gain relatively constant, reducing the distortion present in the prior technology. A further improvement is that the operational timing of the switches 206, 210, 216, 220 and 222 between the first nulling amplifier 208, the second nulling amplifier 218, and the main amplifier 202 function with a make-before-break overlap. This ensures that the main amplifier 202 is continuously driven by one or both of the nulling amplifiers 208 and 218, thus maintaining a low impedance at the main amplifier auxiliary port 242, and also reducing the glitch energy at the output 244. A flywheel capacitor 232 may be added to further reduce the glitch magnitude. Two pair of zeroing switches 206 and 216 are used, one pair for each of the nulling amplifiers 208 and 218, respectively.

Figure 3:
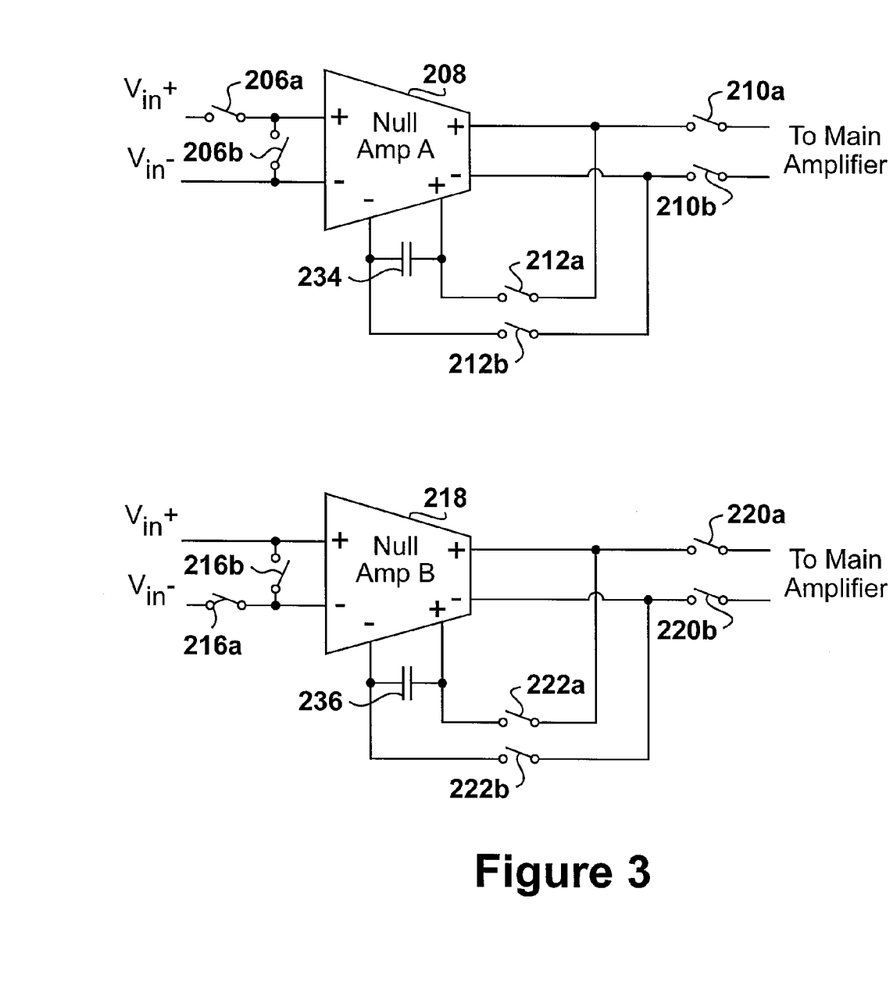
FIG. 3 illustrates schematic diagrams of the first and second nulling amplifiers implemented using a fully-differential topology, according to the specific example embodiment shown in FIG. 2.

Referring to FIG. 3, depicted are schematic diagrams of the first and second nulling amplifiers implemented using a fully-differential topology, according to the specific example embodiment shown in FIG. 2. In order to reduce charge injection errors, the first and second nulling amplifiers 208 and 218, respectively, are implemented using a fully-differential topology. By connecting one zeroing switch pair (e.g., switches 206a and 206b) opposite to the other zeroing switch pair (e.g., switches 216a and 216b) as shown, the glitch energy will tend to average out, i.e., switch 206a is tied to Vin+ when switch 216a is tied to Vin−, and visa versa. Note that the first and second nulling amplifiers 208 and 218, respectively, may not have the same common-mode voltage due to transistor mismatches in their internal common-mode feedback loops. This may present a source of glitching (e.g., unwanted transient noise) because the main auxiliary port 242 of the main amplifier 202 may "see" a sharp change in common-mode voltage when the first and second nulling amplifiers 208 and 218, respectively, are switched between the auxiliary port 242. According to teachings of this disclosure, these glitches may be substantially reduced by adding a common-mode zeroing loop in addition to the normal differential mode zeroing loop so that the first and second nulling amplifiers 208 and 218, respectively, have approximately the same common-mode voltage. One of the nulling amplifiers is being zeroed while the other nulling amplifier is connected to the auxiliary port 242. Thus, zeroing of the two loops is done concurrently so no additional delay is incurred.

Also note that the correction voltage required on the auxiliary port 242 may not be equal to the nulling amplifier output voltage when the nulling amplifier is connected to the auxiliary port 242. This is another source of glitching because the auxiliary port 242 of the main amplifier 202 may "see" a sharp change in differential-mode voltage when the nulling amplifiers 208 or 218 are connected to the auxiliary port 242. According to the teachings of this disclosure, these glitches may be substantially reduced by adding a pre-charge operation to adjust the nulling amplifier output voltage to substantially match the required nulling correction voltage on the auxiliary port 242 prior to connecting the nulling amplifer to the auxiliary port 242.

Figure 4A:
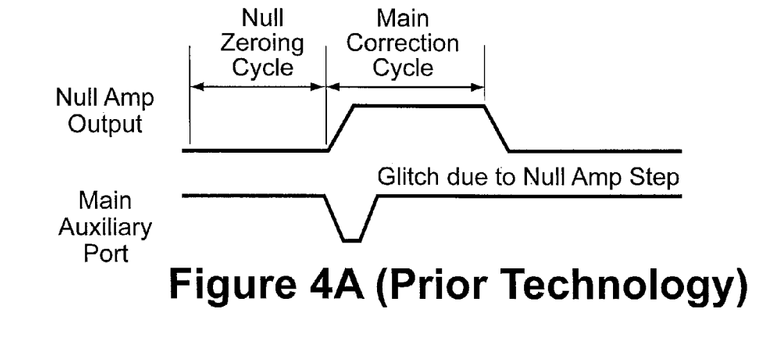
FIGS. 4(a), 4(b) and 4(c) illustrate schematic timing diagrams showing transient ("glitch") behavior of a prior technology auto-zeroed operational amplifier during offset correction.
Figure 4B:
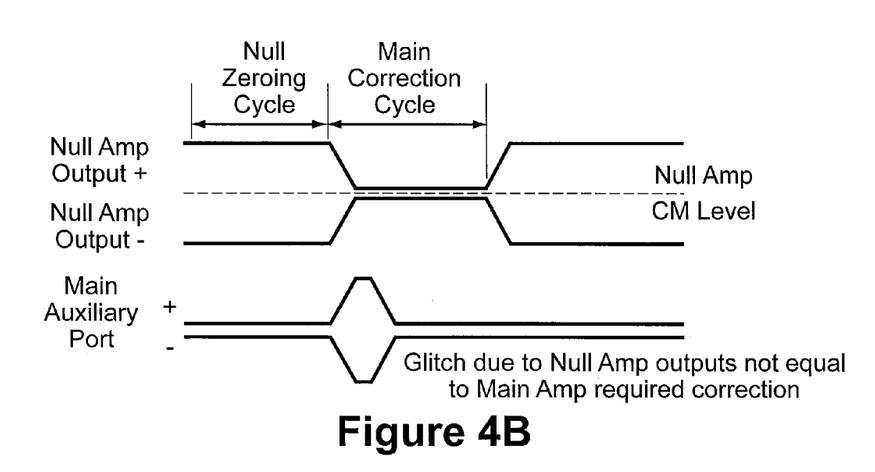
Figure 4C:
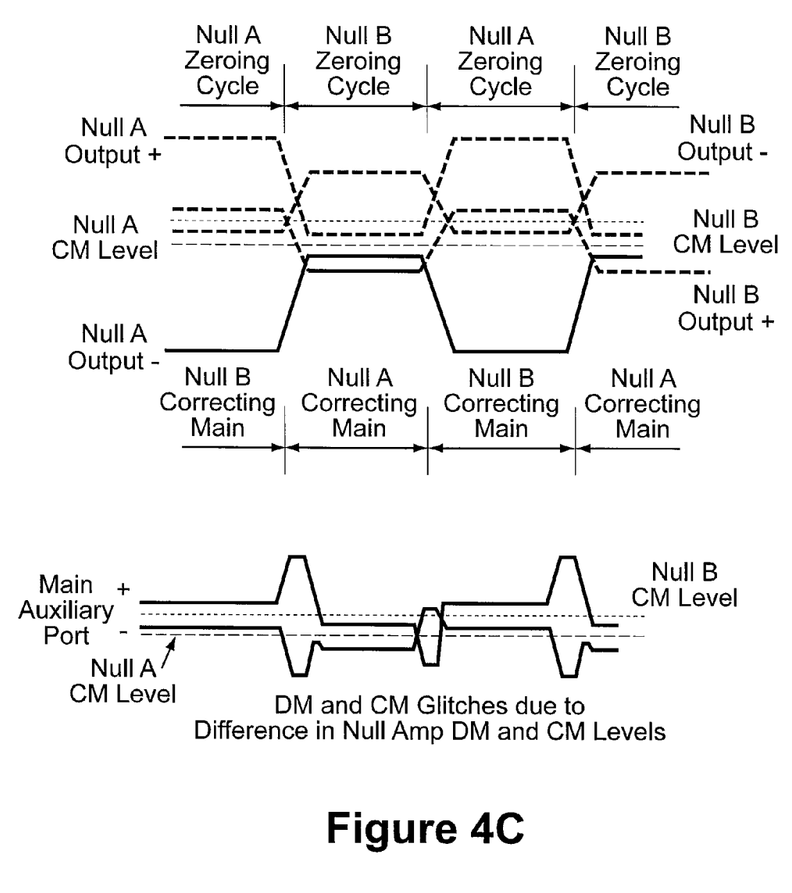

Referring to FIGS. 4(a), 4(b) and 4(c), depicted are schematic timing diagrams showing transient ("glitch") behavior of prior technology auto-zeroed operational amplifiers during offset correction. In prior technology auto-zeroed amplifiers (e.g., FIG. 1), the nulling amplifier differential mode error (offset) is zeroed, then used to correct the main amplifier offset. Mismatches between the main and nulling amplifiers may cause glitches when the nulling amplifier is connected to the main auxiliary port. This is because at the end of the zeroing cycle the nulling amplifier output voltage may not be the same as what the main auxiliary port needs to correct the main amplifier offset. FIGS. 4(a) and 4(b) show this behavior in both ground-referenced and differential operational amplifier topologies, respectively, using a single nulling amplifier. FIG. 4(c) shows the case with dual nulling amplifiers and highlights the common-mode level issue. Both a differential mode (DM) and common-mode (CM) step occurs when the two nulling amplifiers are switched.

To reduce glitches, a prior technology pre-charge method has been used to adjust the nulling amplifier outputs to the proper level before connecting to the main amplifier. However, this prior technology method does not address a fully differential topology, nor handle the case of utilizing two nulling amplifiers. If this scheme is used in this case, and only one nulling amplifier output is precharged (either positive or negative node), the other output will adjust to maintain its output common-mode level. Since the common-mode of the two nulling amplifiers are different, a differential and common-mode step will occur when the nulling amplifiers are switched, negating the advantage of the pre-charge cycle.

Figure 4D:
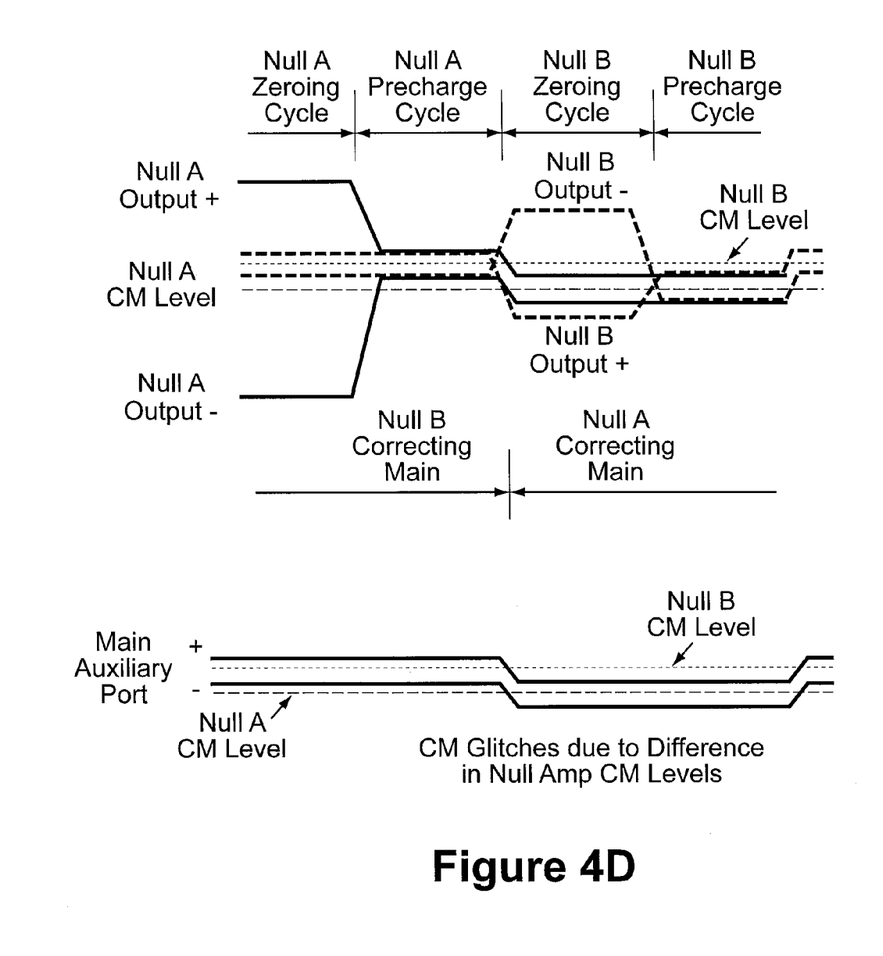
FIG. 4(d) illustrates a schematic timing diagram showing transient ("glitch") behavior of a case where both nulling amplifier outputs are pre-charged to match the expected main auxiliary port voltage before switching nulling amplifiers.

Referring to FIG. 4(d), depicted is a schematic timing diagram showing transient ("glitch") behavior of a case where both nulling amplifier outputs are pre-charged to match the expected main auxiliary port voltage before switching nulling amplifiers. A common-mode step will occur when the nulling amplifiers are switched because of the different common mode (CM) levels of the two amplifiers. Although improved, it is still not as good as the case, according to the teachings of this disclosure, where there is a common mode zeroing operation. Because the common-mode rejection at higher frequencies is likely to be low allowing much of the glitch energy to pass to the output. The combination of pre-charging and common-mode zeroing, according to the teachings of this disclosure, ensures that both nulling amplifier outputs are properly adjusted to the correct differential mode and common-mode voltages, further reducing glitches at the output.

Figure 4E:
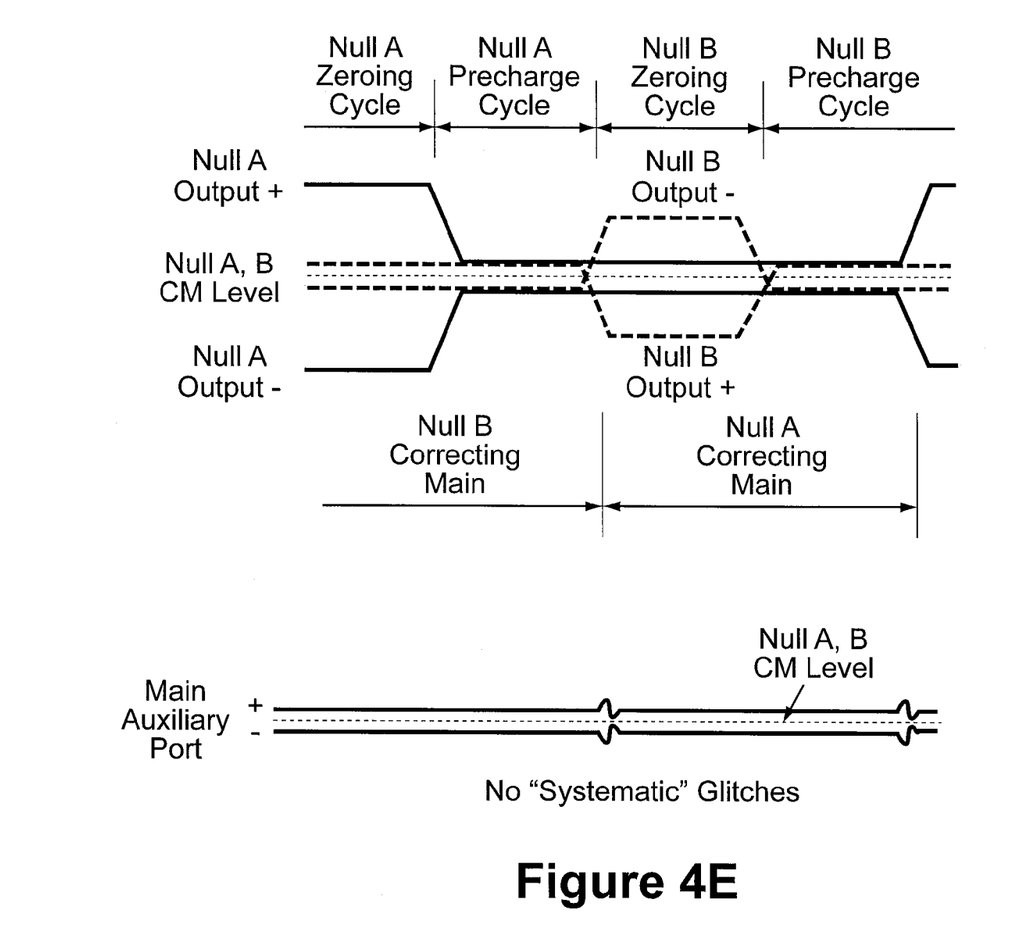
FIG. 4(e) illustrates a schematic timing diagram showing transient ("glitch") behavior where both pre-charging and common-mode zeroing are used to reduce output glitches, according to a specific example embodiment of this disclosure.

Referring to FIG. 4e, depicted is a schematic timing diagram showing transient ("glitch") behavior where both pre-charging and common-mode zeroing are used to reduce output glitches, according to a specific example embodiment of this disclosure. As shown, only small, residual glitches may occur at the main amplifier auxiliary ports due to charge injection and/or clock feed-through. Substantially no systematic glitches are present which could cause an average DC offset.

Figure 5:
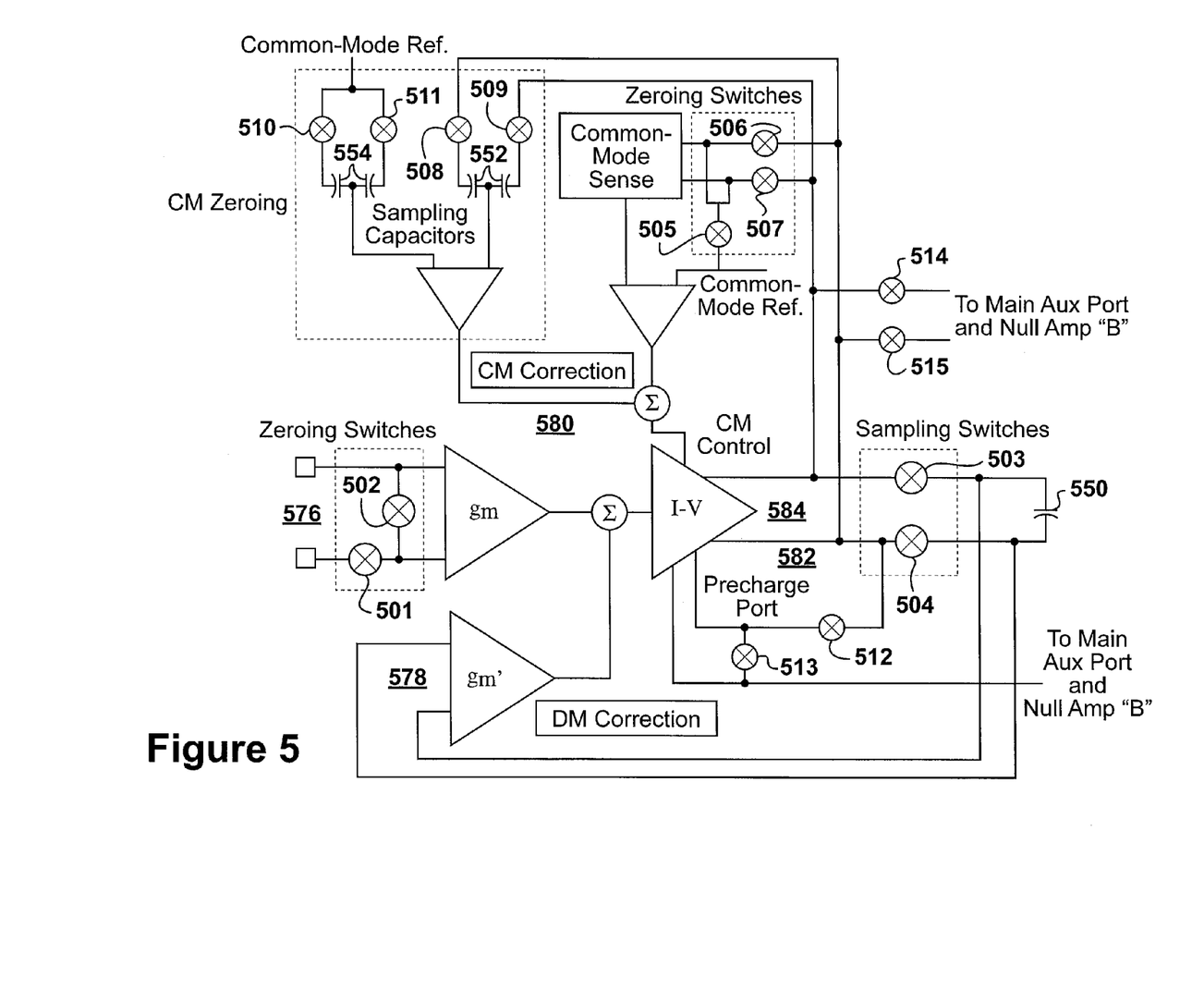
FIG. 5 illustrates a more detailed schematic block diagram of the nulling amplifiers shown in FIG. 2, according to a specific example embodiment of this disclosure.

Referring to FIG. 5, depicted is a more detailed schematic block diagram of the nulling amplifiers shown in FIG. 2, according to a specific example embodiment of this disclosure. Each nulling amplifier (208, 218) has four input ports and one output port. The input ports consist of a primary signal input port 576, an auxiliary differential mode (DM) correction port 578, an auxiliary common-mode (CM) correction port 580, and a pre-charge port 582. Internal to each of the nulling amplifiers are transconductance stages associated with each of the input ports, summing junctions for the differential mode and common-mode paths, a current-to-voltage converter and a common-mode feedback network for the output stage.

During operation, the primary input port 576 is connected to the inputs of the main amplifier 202 (FIG. 2) and is shorted to one of the inputs during the zeroing cycle using switches 501 and 502. The differential mode error (offset) of the nulling amplifier is sampled using switches 503 and 504, stored on capacitor 550, and applied to the nulling auxiliary (correction) port 232 (FIG. 2). Due to the high loop gain of the main auxiliary port 242 to the output port 244, the input referred offset at the primary input port may be nulled.

At the same time, the outputs are disconnected from the common-mode feedback network and replaced by a common-mode reference via switches 505 through 507. The common-mode error is also sampled, using switches 508 and 509, stored on capacitors 552, and applied to one side of the nulling common-mode auxiliary (correction) port 580. The common-mode reference 570 is also sampled, using switches 510 and 511, stored on capacitors 554, and applied to the other side of the nulling common-mode auxiliary (correction) port 580. Capacitors 552 and 554 are matched pairs. In this manner, assuming a high loop gain of the common-mode auxiliary port 580 to the output CM level, a correction differential voltage is applied to the nulling common-mode auxiliary port 580 to zero the common-mode error of the main amplifier 202.

After zeroing, the main amplifier 202 output 244 (either positive or negative) is precharged via switches 512, 513 and the precharge port 582 to the main auxiliary port level. Finally, the two nulling amplifiers 208 and 218 (FIG. 2) are switched and the cycle repeated for the other nulling amplifier.

The precharge operation adjusts the nulling amplifier output levels to substantially the same levels as at the main auxiliary port 242 as follows. Normally, precharge port switch 513 is closed and switch 512 is open. During precharge, switch 513 is open and switch 512 is closed. The precharge port has one input connected to the main auxiliary port 242, which is being driven by the other nulling amplifier. The other precharge port input is connected to the nulling amplifier output. The precharge cycle adjusts the nulling amplifier outputs to match the voltage at the main auxiliary port 242.

An additional improvement to reduce offset and glitch effects, according to teachings of this disclosure, may be to commutate the nulling amplifiers 208 and 218 on subsequent cycles. Both of the nulling amplifier inputs and outputs are interchanged so that any residual errors and/or glitch energy due to mismatch, switching or charge injection may be averaged. In addition, the inputs of the pre-charge port 582 may be swapped to pre-charge the output to the correct level depending on the output polarity.

Figure 6:
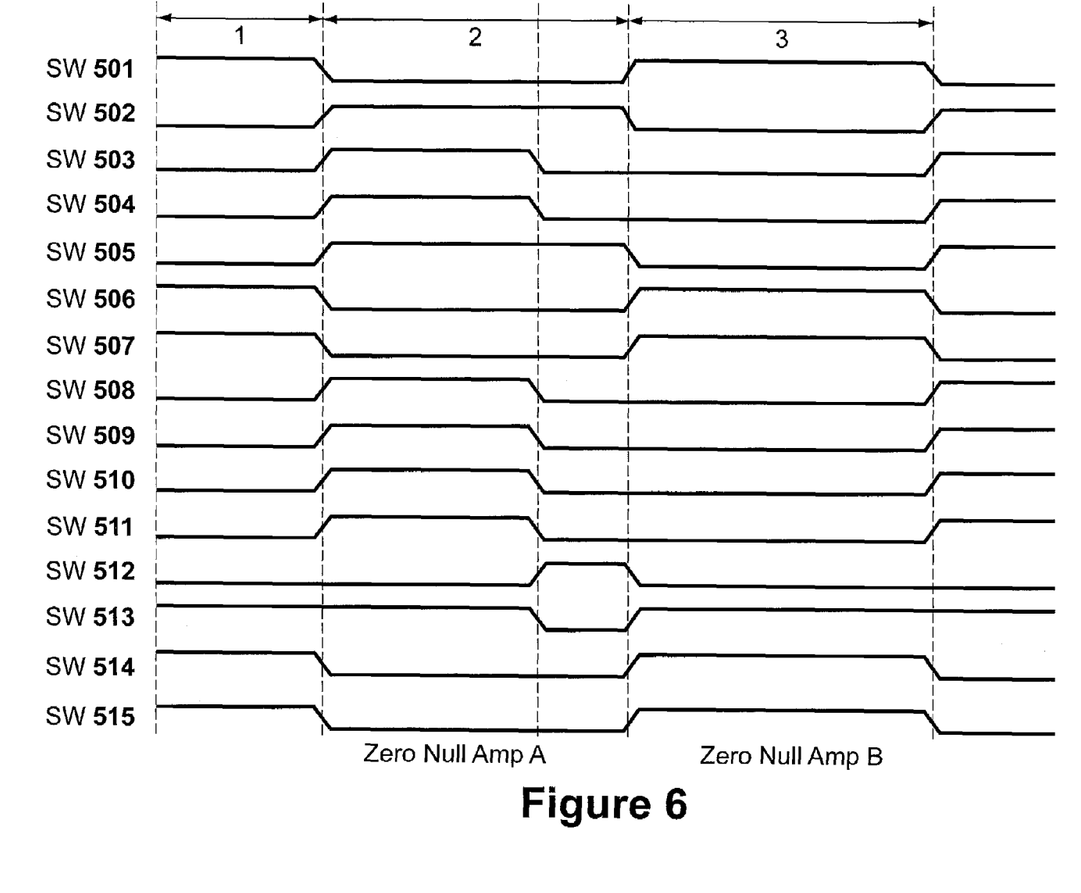
FIG. 6 illustrates timing diagrams for the operation of the auto-zeroed operational amplifier and nulling amplifiers shown in FIG. 5, according to a specific example embodiment of this disclosure.

Referring to FIG. 6, depicted are timing diagrams for the operation of the auto-zeroed operational amplifier and nulling amplifiers shown in FIG. 5, according to a specific example embodiment of this disclosure. The nulling amplifier differential and common-mode zeroing switches are set: switches 501, 506 and 507 are open and switches 502 and 505 are closed. At the same time, the sampling switches 503, 504 and 508-511 are closed, switch 512 is open, switch 513 is closed, and switches 514 and 515 are open. Once the differential and common-mode correction voltages are sampled, the sampling switches are opened, and the correction voltages are held. Next, the pre-charge occurs by closing switch 512 and opening switch 513. Following pre-charge, switches 512 and 513 are reversed and the auxiliary port switches 514 and 515 are closed, allowing the zeroed nulling amplifier to drive the main auxiliary port. The zeroing, precharge and main switches are designed to be make-before-break, so the input ports never see a high impedance so as to minimize glitches.

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An auto-zeroing differential amplifier, comprising:
   a main amplifier having differential inputs, differential outputs, and an auxiliary port having differential inputs;
   a first nulling amplifier configured for differential and common mode self correction, the first nulling amplifier having differential inputs and outputs;
   a second nulling amplifier configured for differential and common mode self correction, the second nulling amplifier having differential inputs and outputs;
   first nulling amplifier input zeroing switches coupled to the main amplifier differential inputs and the first nulling amplifier differential inputs, wherein the first nulling amplifier input zeroing switches are used during offset zeroing of the main amplifier by the first nulling amplifier;
   second nulling amplifier input zeroing switches coupled to the main amplifier differential inputs and the second nulling amplifier differential inputs, wherein the second nulling amplifier input zeroing switches are used during offset zeroing of the main amplifier by the second nulling amplifier;
   first nulling amplifier output switches coupled between the first nulling amplifier differential outputs and the main amplifier auxiliary port differential inputs, wherein the first nulling amplifier output switches couple the first nulling amplifier differential outputs to the main amplifier auxiliary port differential inputs during offset zeroing of the main amplifier by the first nulling amplifier; and
   second nulling amplifier output switches coupled between the second nulling amplifier differential outputs and the main amplifier auxiliary port differential inputs, wherein the second nulling amplifier output switches couple the second nulling amplifier differential outputs to the main amplifier auxiliary port differential inputs during offset zeroing of the main amplifier by the second nulling amplifier;

wherein when one of the nulling amplifiers is offset zeroing the main amplifier, the other nulling amplifier is doing a common-mode self offset zeroing.

2. The auto-zeroed amplifier according to claim 1, further comprising both of the first and second nulling amplifiers are pre-charged so that the differential outputs thereof are at substantially the same correction voltage required for offset zeroing of the main amplifier.

3. The auto-zeroed amplifier according to claim 1, wherein each of the first and second nulling amplifiers comprises:

a primary signal input port, wherein the primary signal input port is coupled to the differential inputs of the main amplifier and is shorted thereto during a zeroing cycle;

an auxiliary differential mode (DM) correction port, wherein a differential mode offset of the nulling amplifier is sampled and stored in respective DM capacitors, and thereafter applied to respective auxiliary DM nulling ports for each of the nulling amplifiers;

an auxiliary common-mode (CM) correction port, wherein a common-mode error is sampled and stored in respective CM capacitors, and thereafter applied to respective auxiliary CM nulling ports for each of the nulling amplifiers; and a pre-charge port.

4. The auto-zeroed amplifier according to claim 1, wherein each of the first and second nulling amplifiers comprises:

a primary signal input port, wherein the primary signal input port is coupled to the differential inputs of the main amplifier and is shorted thereto during a zeroing cycle;

an auxiliary differential mode (DM) correction port, wherein a differential mode offset of the nulling amplifier is sampled and stored in respective DM capacitors, and thereafter applied to respective auxiliary DM nulling ports for each of the nulling amplifiers; and a pre-charge port.

5. The auto-zeroed amplifier according to claim 1, wherein each of the first and second nulling amplifiers comprises:

a primary signal input port, wherein the primary signal input port is coupled to the differential inputs of the main amplifier and is shorted thereto during a zeroing cycle;

an auxiliary common-mode (CM) correction port, wherein a common-mode error is sampled and stored in respective CM capacitors, and thereafter applied to respective auxiliary CM nulling ports for each of the nulling amplifiers; and a pre-charge port.

6. The auto-zeroed amplifier according to claim 3, wherein each nulling amplifier comprises:

transconduction stages associated with each of the input ports;

summing junctions associated with the DM and CM correction ports; and an output circuit having a current-to-voltage converter and a CM feedback network.

7. The auto-zeroed amplifier according to claim 3, wherein each of the first and second nulling amplifiers are precharged to substantially the same voltage level at the main amplifier auxiliary port.

8. The auto-zeroed amplifier according to claim 3, wherein the first and second nulling amplifier inputs and outputs are interchanged to average out residual sampling errors.

9. The auto-zeroed amplifier according to claim 3, wherein all switching operations are make before break.

10. The auto-zeroed amplifier according to claim 3, further comprising an output buffer having differential inputs and an output, wherein the differential inputs of the output buffer are coupled to the differential outputs of the main amplifier.

11. An auto-zeroing differential amplifier, comprising:

a main amplifier having an input, an output, and an auxiliary input;

a first nulling amplifier configured for differential mode and common mode self correction;

a second nulling amplifier configured for differential mode and common mode self correction;

first nulling amplifier input zeroing switches coupled to the main amplifier input and the first nulling amplifier input, wherein the first nulling amplifier input zeroing switches are used during offset zeroing of the main amplifier by the first nulling amplifier;

second nulling amplifier input zeroing switches coupled to the main amplifier input and the second nulling amplifier input, wherein the second nulling amplifier input zeroing switches are used during offset zeroing of the main amplifier by the second nulling amplifier;

first nulling amplifier output switches coupled between the first nulling amplifier output and the main amplifier auxiliary input, wherein the first nulling amplifier output switches couple the first nulling amplifier output to the main amplifier auxiliary input during offset zeroing of the main amplifier by the first nulling amplifier; and second nulling amplifier output switches coupled between the second nulling amplifier output and the main amplifier auxiliary input, wherein the second nulling amplifier output switches couple the second nulling amplifier output to the main amplifier auxiliary input during offset zeroing of the main amplifier by the second nulling amplifier;

wherein when one of the nulling amplifiers is offset zeroing the main amplifier, the other nulling amplifier is doing a common-mode self offset zeroing.

12. The auto-zeroed amplifier according to claim 11, further comprising both of the first and second nulling amplifiers being pre-charged so that the outputs thereof are at substantially the same correction voltage required for offset zeroing of the main amplifier.

13. The auto-zeroed amplifier according to claim 11, wherein each of the first and second nulling amplifiers comprises:

a primary signal input port, wherein the primary signal input port is coupled to the input of the main amplifier and is shorted thereto during a zeroing cycle;

an auxiliary differential mode (DM) correction port, wherein a differential mode offset of the nulling amplifier is sampled and stored in respective DM capacitors, and thereafter applied to respective auxiliary DM nulling ports for each of the nulling amplifiers;

an auxiliary common-mode (CM) correction port, wherein a common-mode error is sampled and stored in respective CM capacitors, and thereafter applied to respective auxiliary CM nulling ports for each of the nulling amplifiers; and a pre-charge port.

14. The auto-zeroed amplifier according to claim 11, wherein each of the first and second nulling amplifiers comprises:
 a primary signal input port, wherein the primary signal input port is coupled to the input of the main amplifier and is shorted thereto during a zeroing cycle;
 an auxiliary differential mode (DM) correction port, wherein a differential mode offset of the nulling amplifier is sampled and stored in respective DM capacitors, and thereafter applied to respective auxiliary DM nulling ports for each of the nulling amplifiers; and
 a pre-charge port.

15. The auto-zeroed amplifier according to claim 11, wherein each of the first and second nulling amplifiers comprises:
 a primary signal input port, wherein the primary signal input port is coupled to the input of the main amplifier and is shorted thereto during a zeroing cycle;
 an auxiliary common-mode (CM) correction port, wherein a common-mode error is sampled and stored in respective CM capacitors, and thereafter applied to respective auxiliary CM nulling ports for each of the nulling amplifiers; and
 a pre-charge port.

16. The auto-zeroed amplifier according to claim 13, wherein each nulling amplifier comprises:
 transconduction stages associated with each of the input ports;
 summing junctions associated with the DM and CM correction ports; and
 an output circuit having a current-to-voltage converter and a CM feedback network.

17. The auto-zeroed amplifier according to claim 13, wherein each of the first and second nulling amplifiers are precharged to substantially the same voltage level at the main amplifier auxiliary port.

18. The auto-zeroed amplifier according to claim 13, wherein the first and second nulling amplifier inputs and outputs are interchanged to average out residual sampling errors.

19. The auto-zeroed amplifier according to claim 11, wherein all switching operations are make before break.

20. The auto-zeroed amplifier according to claim 11, further comprising an output buffer having an input and an output, wherein the input of the output buffer is coupled to the output of the main amplifier.

21. A method of minimizing switching noise in auto-zeroed amplifiers, said method comprising the steps of:
 providing a main amplifier having differential signal inputs and outputs, and differential auxiliary inputs;
 providing first and second nulling amplifiers having differential signal inputs, differential outputs and differential auxiliary inputs, wherein the differential signal inputs and differential outputs are switchably coupled to the main amplifier differential signal inputs and differential auxiliary inputs;
 nulling a differential mode (DM) offset error of the main amplifier by:
  storing the DM offset error in first and second DM offset error capacitors coupled to the first and second nulling amplifiers, respectively, and
  applying the stored DM offset error to the main amplifier differential auxiliary inputs;
 nulling a common mode (CM) offset error of the main amplifier by
  sampling the CM offset error,
  storing the CM offset error in first and second CM offset error capacitors coupled to the first and second nulling amplifiers, respectively, and
  applying the stored CM offset error to the main amplifier differential auxiliary inputs; and
 precharging the first and second nulling amplifier differential outputs to substantially the same voltage level as at the main amplifier differential auxiliary inputs.

22. The method according to claim 21, further comprising the steps of commutating the first and second nulling amplifiers by interchanging the inputs and outputs thereof on subsequent nulling cycles.

23. The method according to claim 21, further comprising the step of interchanging pre-charge port inputs of the first and second nulling amplifiers depending upon a signal polarity of the main amplifier differential signal outputs.

24. A method of minimizing switching noise in auto-zeroed amplifiers, said method comprising the steps of:
 providing a main amplifier having a signal input and an output, and an auxiliary input;
 providing first and second nulling amplifiers having signal inputs, outputs and auxiliary inputs, wherein the signal inputs and outputs are switchably coupled to the main amplifier signal input and auxiliary input;
 nulling a differential mode (DM) offset error of the main amplifier by:
  storing the DM offset error in first and second DM offset error capacitors coupled to the first and second nulling amplifiers, respectively, and
  applying the stored DM offset error to the main amplifier auxiliary input;
 nulling a common mode (CM) offset error of the main amplifier by
  sampling the CM offset error,
  storing the CM offset error in first and second CM offset error capacitors coupled to the first and second nulling amplifiers, respectively, and
  applying the stored CM offset error to the main amplifier auxiliary input; and
 precharging the first and second nulling amplifier outputs to substantially the same voltage level as at the main amplifier auxiliary input.

25. The method according to claim 24, further comprising the steps of commutating the first and second nulling amplifiers by interchanging the inputs and outputs thereof on subsequent nulling cycles.

26. A method of minimizing switching noise in auto-zeroed amplifiers, said method comprising the steps of:
 providing a main amplifier having differential signal inputs and outputs, and differential auxiliary inputs;
 providing first and second nulling amplifiers having differential signal inputs, differential outputs and differential auxiliary inputs, wherein the differential signal inputs and differential outputs are switchably coupled to the main amplifier differential signal inputs and differential auxiliary inputs;
 nulling a differential mode (DM) offset error of the main amplifier by:
  storing the DM offset error in first and second DM offset error capacitors coupled to the first and second nulling amplifiers, respectively, and
  applying the stored DM offset error to the main amplifier differential auxiliary inputs;
 nulling a common mode (CM) offset error of the main amplifier by
  sampling the CM offset error, storing the CM offset error in first and second CM offset error capacitors coupled to the first and second nulling amplifiers, respectively, and applying the stored CM offset error to the main amplifier differential auxiliary inputs.

27. The method according to claim 26, further comprising the steps of precharging the first and second nulling amplifier differential outputs to substantially the same voltage level as at the main amplifier differential auxiliary inputs.

28. The method according to claim 26, further comprising the steps of commutating the first and second nulling amplifiers by interchanging the inputs and outputs thereof on subsequent nulling cycles.

29. The method according to claim 26, further comprising the step of interchanging pre-charge port inputs of the first and second nulling amplifiers depending upon a signal polarity of the main amplifier differential signal outputs.

30. A method of minimizing switching noise in auto-zeroed amplifiers, said method comprising the steps of:
providing a main amplifier having a signal input and an output, and an auxiliary input;
providing first and second nulling amplifiers having signal inputs, outputs and auxiliary inputs, wherein the signal inputs and outputs are switchably coupled to the main amplifier signal input and auxiliary input;
nulling a differential mode (DM) offset error of the main amplifier by:
storing the DM offset error in first and second DM offset error capacitors coupled to the first and second nulling amplifiers, respectively, and
applying the stored DM offset error to the main amplifier auxiliary input;
nulling a common mode (CM) offset error of the main amplifier by
sampling the CM offset error,
storing the CM offset error in first and second CM offset error capacitors coupled to the first and second nulling amplifiers, respectively, and
applying the stored CM offset error to the main amplifier auxiliary input.

31. The method according to claim 30, further comprising the steps of precharging the first and second nulling amplifier outputs to substantially the same voltage level as at the main amplifier auxiliary input.

32. The method according to claim 30, further comprising the steps of commutating the first and second nulling amplifiers by interchanging the inputs and outputs thereof on subsequent nulling cycles.

\* \* \* \* \*